United States Patent
Yakabe et al.

(10) Patent No.: US 7,891,090 B2
(45) Date of Patent: Feb. 22, 2011

(54) METHOD FOR MANUFACTURING AN INTERPOSER

(75) Inventors: Masami Yakabe, Tokyo (JP); Tomohisa Hoshino, Amagasaki (JP)

(73) Assignee: Tokyo Electron Limited (JP)

( * ) Notice: Subject to any disclaimer, the term of this patent is extended or adjusted under 35 U.S.C. 154(b) by 84 days.

(21) Appl. No.: 11/884,075

(22) PCT Filed: Feb. 9, 2006

(86) PCT No.: PCT/JP2006/002238

§ 371 (c)(1),
(2), (4) Date: Aug. 9, 2007

(87) PCT Pub. No.: WO2006/085573

PCT Pub. Date: Aug. 17, 2006

(65) Prior Publication Data

US 2008/0171452 A1    Jul. 17, 2008

(30) Foreign Application Priority Data

Feb. 10, 2005    (JP) .............................. 2005-035043

(51) Int. Cl.
*H01R 9/00* (2006.01)
*H05K 3/00* (2006.01)

(52) U.S. Cl. .............................. 29/842; 29/852; 29/874; 29/896.9

(58) Field of Classification Search .................. 29/842, 29/840, 852, 874, 884, 885, 896.9; 257/E21.507, 257/E21.508, E23.021, E23.067, E25.023; 439/54, 66, 78, 81, 876

See application file for complete search history.

(56) References Cited

U.S. PATENT DOCUMENTS

| 5,806,181 | A * | 9/1998 | Khandros et al. ............. 29/874 |
| 6,114,240 | A * | 9/2000 | Akram et al. ............... 438/667 |
| 6,538,214 | B2 | 3/2003 | Khandros |
| 2002/0142509 | A1 | 10/2002 | Hattori et al. |
| 2003/0155940 | A1 | 8/2003 | Lee et al. |
| 2003/0189439 | A1 | 10/2003 | Kohno et al. |

(Continued)

FOREIGN PATENT DOCUMENTS

JP    2000-321302    11/2000

(Continued)

OTHER PUBLICATIONS

European Search Report, dated Apr. 1, 2008.

*Primary Examiner*—Thiem Phan
(74) *Attorney, Agent, or Firm*—Finnegan, Henderson, Farabow, Garrett & Dunner, LLP

(57) ABSTRACT

A method for manufacturing an interposer including a body and a plurality of probes connected to said body is disclosed. The method includes a step of manufacturing said body including the sub-steps of preparing a first substrate having one surface side and the other surface side and being capable of being processed by dry etching, forming a plurality of through holes in said first substrate by dry etching, and making said through holes into conductive holes capable of conducting electricity through a bottom-up fill process. The method also includes a step of manufacturing said plurality of probes and connecting the ends of said plurality of conductive holes on one surface side of said first substrate and a plurality of first probes on said second substrate.

5 Claims, 5 Drawing Sheets

U.S. PATENT DOCUMENTS

| | | |
|---|---|---|
| 2004/0166702 A1 | 8/2004 | Higashi |
| 2005/0092709 A1 | 5/2005 | Chun et al. |

FOREIGN PATENT DOCUMENTS

| | | |
|---|---|---|
| JP | 2002-531915 | 9/2002 |
| JP | 2003-129286 | 5/2003 |
| JP | 2004-259530 | 9/2004 |
| KR | 2004-0083726 | 10/2004 |
| WO | WO 97/44676 | 11/1997 |
| WO | WO 00/33089 | 6/2000 |
| WO | WO 02/15260 A1 | 2/2002 |
| WO | WO 2004/030080 A1 | 4/2004 |

* cited by examiner

PRIOR ART

METHOD FOR MANUFACTURING AN INTERPOSER

TECHNICAL FIELD

The present invention relates to an interposer, a probe card and a method for manufacturing the interposer. In particular, the invention relates to an interposer on which probes can be arranged at high density, a probe card and a method for manufacturing the interposer.

BACKGROUND ART

A conventional interposer is disclosed in U.S. Pat. No. 6,538,214, for example.

FIG. 8 shows the structure of the interposer disclosed in U.S. Pat. No. 6,538,214. Referring to FIG. 8, the interposer 100 includes a ceramic substrate 101 provided with a plurality of conductive holes 102, terminals 103 connected to the conductive holes 102 and arranged on both sides of the substrate 101, and a plurality of probes 104 connected to the terminals 103. On a tip of each probe 104, a contact 105 is provided.

Typical interposers have a similar structure to the one discussed above. Because the substrate 101 is made of ceramic, the formation of the conductive holes necessarily involves drilling or sandblasting the substrate to form through holes and making the through holes conductive, and therefore it is impossible to form conductive holes having a small dimension. As a result, probes cannot be arranged at high density on the ceramic substrate.

DISCLOSURE OF THE INVENTION

The present invention was made in view of the above problem and has an object to provide an interposer on which probes can be arranged at high density, a probe card and a method for manufacturing the interposer.

The interposer according to the present invention includes a substrate that can be processed by dry etching. The substrate includes a plurality of conductive holes penetrating from one side to the other side of the substrate and contact elements each formed at an end of the conductive hole on at least one side of the substrate.

Because the substrate in which the conductive holes are to be formed can be processed by dry etching, continuous formation of a plurality of microscopic conductive holes, which will be connected to the contact elements, can be realized.

Accordingly, an interposer with contact elements arranged thereon at high density can be provided.

Preferably, the contact elements are probes.

More preferably, the plurality of contact elements, which are formed on the plurality of conductive holes, are spaced from each other by a distance of 100 μm or less.

The substrate, which can be processed by dry etching, may be a silicon substrate, an organic substrate, a silicon dioxide substrate or a glass substrate.

More preferably, the conductive hole has a diameter of 100 μm or less.

In another aspect of the present invention, the interposer includes: a substrate that can be processed by dry etching and has a plurality of conductive holes penetrating both sides of the substrate; pads each having a diameter greater than that of each conductive hole; and probes connected to the pads. The pads are connected to the conductive holes and mounted on a surface of the substrate.

The conductive holes of the interposer and probes are connected with the pads each having a diameter greater than that of the conductive hole. Even if the conductive holes are somewhat misaligned, the probes can be connected at desired positions.

In yet another aspect of the present invention, the probe card includes a card body and probes individually connected to bonding portions formed so as to protrude from the card body. The probe card is used for inspecting electrical characteristics of test objects. The card body includes a substrate that can be processed by dry etching and has a plurality of conductive holes penetrating both sides of the substrate, and pads, each of which is connected to each conductive hole, provided on a surface of the substrate and has a diameter greater than that of the conductive hole.

The card body of the probe card includes a substrate that can be processed by dry etching. The substrate has a plurality of conductive holes penetrating therethrough. The probes are mounted at the ends of the conductive holes on one side of the substrate.

Accordingly, a probe card with the probes arranged thereon at high density can be provided.

In still another aspect of the present invention, the method for manufacturing the interposer, which includes a body and a plurality of probes connected to the body, includes a step of manufacturing the body and a step of manufacturing the probes. The step of manufacturing the body includes a sub-step of preparing a first substrate that has one surface side and the other surface side and can be processed by dry etching, a sub-step of forming a plurality of through holes in the first substrate by dry etching, and a sub-step of making the through holes into conductive holes capable of conducting electricity. The step of manufacturing the probes includes a sub-step of preparing a second substrate, a sub-step of forming a desired shaped mold on a surface of the second substrate using a resist, and a sub-step of forming a plurality of first probes in the desired shape using the mold. The method for manufacturing the interposer further includes a step of connecting the ends of the plurality of conductive holes on one surface side of the first substrate and the plurality of first probes formed on the second substrate.

The plurality of microscopic conductive holes are formed by dry etching and the probes are attached to the conductive holes, and therefore a method for manufacturing the interposer with the probes arranged thereon at high density can be provided.

Preferably, the step of manufacturing the plurality of probes includes a sub-step of preparing a third substrate, a sub-step of forming a desired shaped mold on a surface of the third substrate using a resist, and a sub-step of forming a plurality of second probes in the desired shape using the mold. The method for manufacturing the interposer includes a step of connecting the ends of the plurality of conductive holes on the other surface side of the first substrate and the plurality of second probes formed on the third substrate.

Preferably, the step of forming the desired shaped mold using the resist includes a sub-step of forming a mold to form zigzag probes.

More preferably, the step of forming the plurality of through holes in the first substrate by dry etching includes a sub-step of forming the holes having a diameter of 100 μm or less.

More preferably, the step of making the through holes into the conductive holes includes a sub-step of plating the through holes with a conductive layer through a bottom-up fill process.

In still another aspect of the present invention, the method for manufacturing the interposer, which includes a body and a plurality of probes connected to the body, includes a step of forming a plurality of probes on a substrate using a resist, a step of exposing the plurality of probes formed on the substrate by removing the resist, a step of connecting the plurality of exposed probes to predetermined positions on the body, and a step of removing the substrate after the plurality of probes are connected to the body.

BEST MODE FOR CARRYING OUT THE INVENTION

Figure 1:
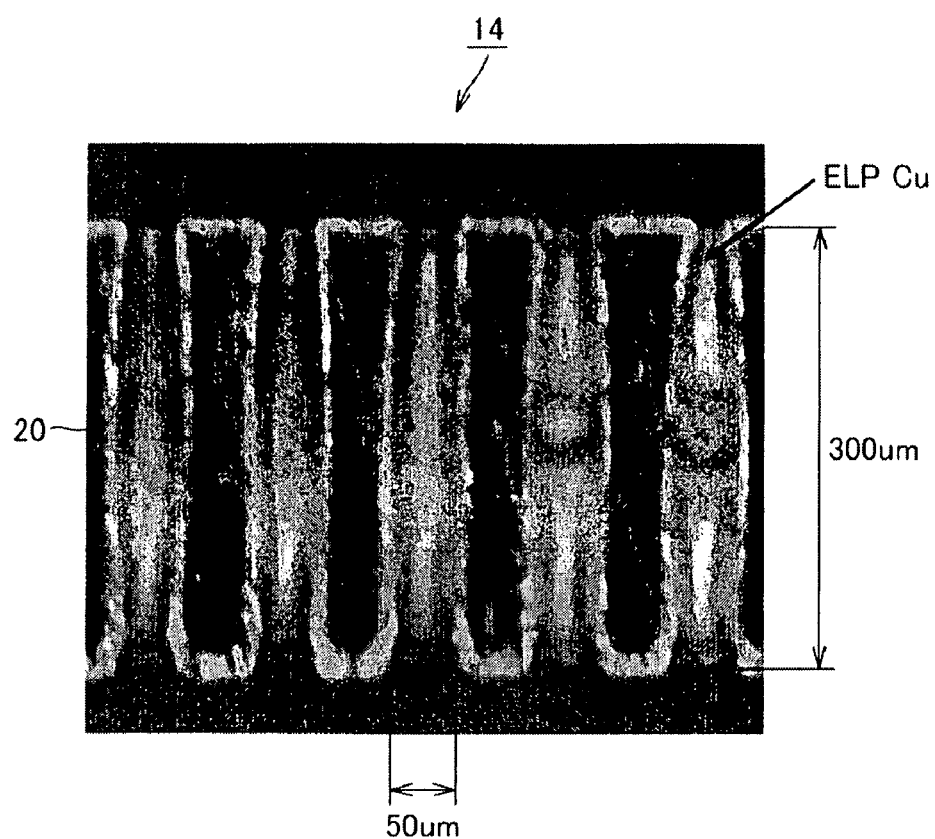
FIG. 1 is a microscope photograph closely representing a substrate that will become a body of an interposer.

With reference to drawings, an embodiment of the present invention will be described below. FIG. 1 is a microscope photograph closely representing a substrate 20 which will become a body 14 of an interposer according to the embodiment. Referring to FIG. 1, the substrate 20 of the interposer according to this embodiment is made of a material that can be processed by dry etching, such as silicon.

Since the substrate is made of a material that can be processed by dry etching such as silicon, a plurality of microscopic through holes each having a diameter of 50 μm can be continuously formed in the substrate 20 having a thickness of 300 μm, for example, as shown in FIG. 1, and the through holes are electroless-plated with copper, resulting in microscopic conductive holes formed at high density. For reference sake, the preferred diameter of the through holes is 100 μm or less in order to realize microfabrication and high-integration.

Figure 2A:
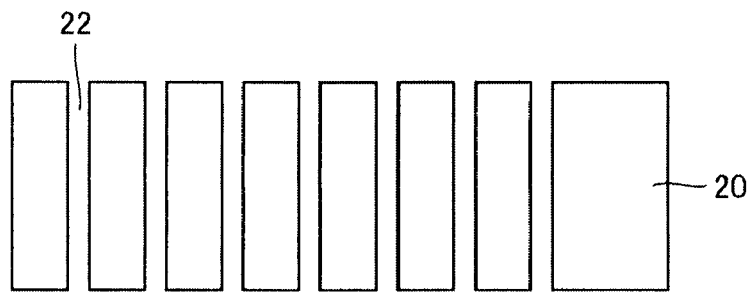
FIG. 2A shows a step of a method for manufacturing a substrate of the interposer.
Figure 2B:
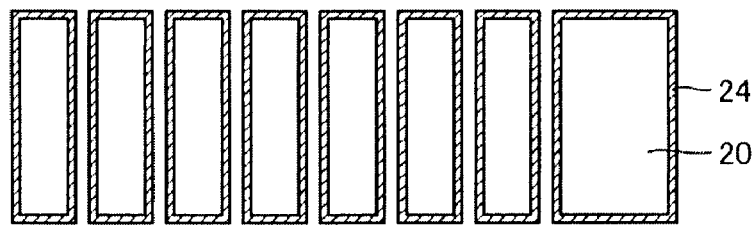
FIG. 2B shows a step of the method for manufacturing the substrate of the interposer.

Next description will be made about a method for manufacturing the body 14 shown in FIG. 1. FIGS. 2A and 2B illustrate steps of the method for manufacturing the substrate of the interposer. First, a silicon substrate 20 is prepared. Then, the substrate 20 is etched to form a plurality of through holes 22, and an oxide film is formed on all surfaces of the substrate 20 (FIG. 2A). Next, electroless plating (ELP) with copper is performed over the oxide film on the substrate 20 to form a copper plating layer 24 (FIG. 2B). Alternatively, the copper plating layer can be formed by electrolessly plating the oxide film with zinc and then electroplating the thus formed zinc plating layer, serving as a seed, with copper.

The reason why the electroless copper plating is preferable is it eliminates the necessity for the use of the seed layer.

Figure 3A:
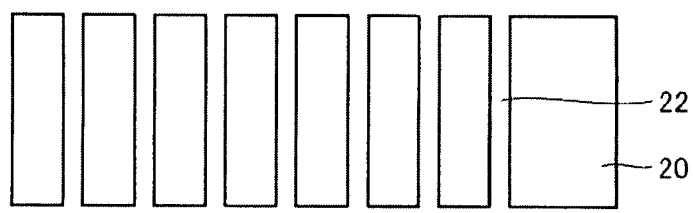
FIG. 3A illustrates an electroless copper plating process discussed in FIGS. 2A and 2B; and a step of forming a body of the interposer through the process.
Figure 3B:
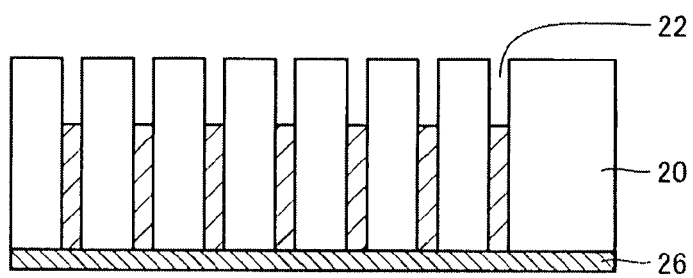
FIG. 3B illustrates the electroless copper plating process discussed in FIGS. 2A and 2B; and a step of forming the body of the interposer through the process.
Figure 3C:
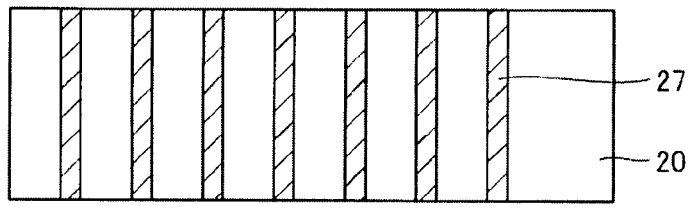
FIG. 3C illustrates the electroless copper plating process discussed in FIGS. 2A and 2B; and a step of forming the body of the interposer through the process.

FIGS. 3A to 3D show different steps of forming the body 14 of the interposer from the steps using the electroless copper plating illustrated in FIGS. 2A and 2B. FIG. 3A illustrates the silicon substrate in the same state as FIG. 2A. As shown in FIG. 3A, a substrate 20 is etched to form through holes 22. Then, on the bottom surface of the substrate 20 on which an oxide film is already formed, a metal plate 26 is bonded, and the through holes 22 are plated with copper through a bottom-up fill process. After conductive holes 27 are formed by filling the through holes 22 with copper by copper plating, the metal plate 26 is removed and both surfaces of the substrate 20 are flattened (FIG. 3C).

Figure 4:
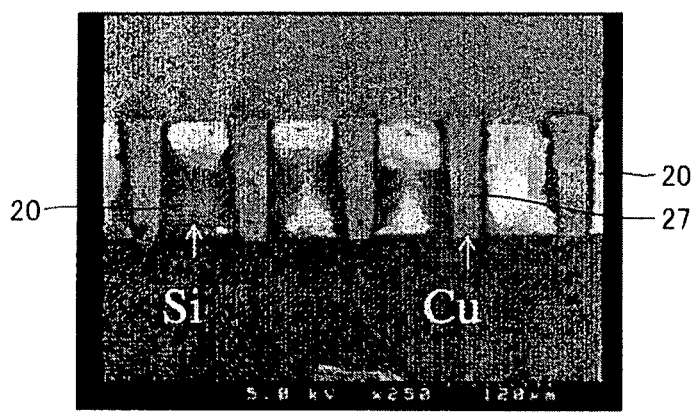
FIG. 4 is a microscope photograph of conductive holes penetrating the substrate as shown in FIG. 3C.

FIG. 4 is a microscope photograph of the conductive holes 27 penetrating the substrate 20 shown in FIG. 3C. As appreciated from FIG. 4, the through holes 22 are fully plated with copper by the bottom-up fill process.

Figure 3D:
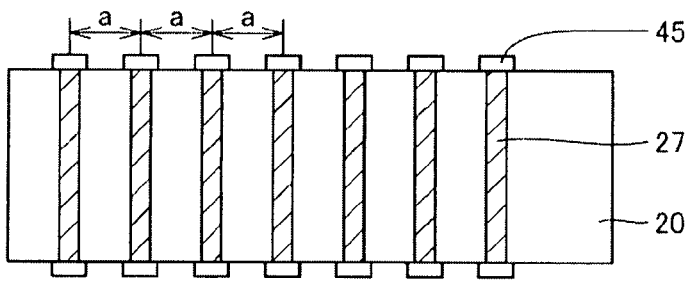
FIG. 3D illustrates the electroless copper plating process discussed in FIGS. 2A and 2B; and a step of forming the body of the interposer through the process.

Next, pads 45 are attached to the opposite ends of the conductive holes 27 so as to be connected with the conductive holes 27 (FIG. 3D). The pads 45 are preferably made of gold. Accordingly, the body 14 is completed. The ease with which gold can be bonded with the probes makes it preferable for the pads.

The spacing a between the conductive holes 27 in the body 14 (i.e. the center-to-center distance between the pads 45) is set to a predetermined dimension of 100 μm or less.

Figure 5A:
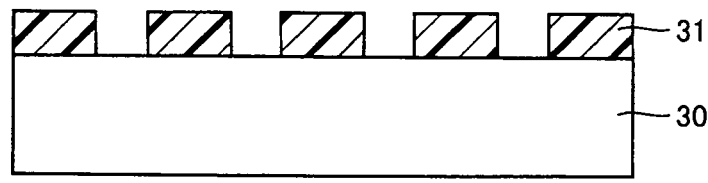
FIG. 5A shows a step of a method for manufacturing probes.

Next description will be made about a method for manufacturing probes attached via the pads 45 to the through holes 22 of the body 14. FIGS. 5A to 5F each shows a step of the manufacturing method of the probes. First, resists 31 are applied at predetermined positions on the upper surface of a substrate 30 (FIG. 5A).

Figure 5B:
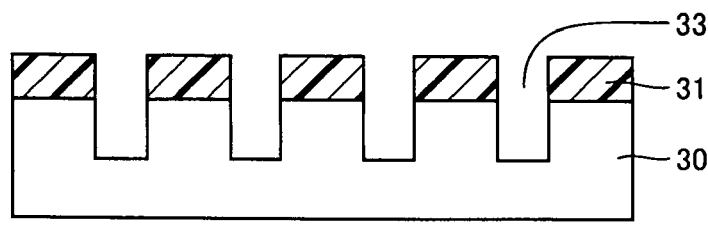
FIG. 5B shows a step of the method for manufacturing the probes.
Figure 5C:
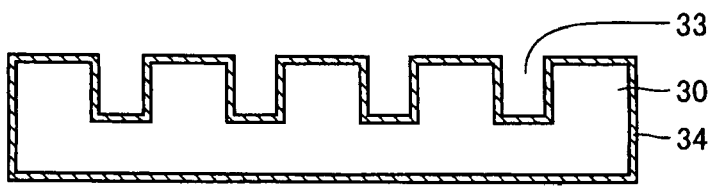
FIG. 5C shows a step of the method for manufacturing the probes.

Next, the substrate 30 is dry-etched to a predetermined depth using the resists 31 as a mask, thereby forming grooves 33 (FIG. 5B). Subsequently, the resists 31 are removed, and the substrate 30 is generally oxidized to form a silicon oxide film 34 (FIG. 5C).

Figure 5D:
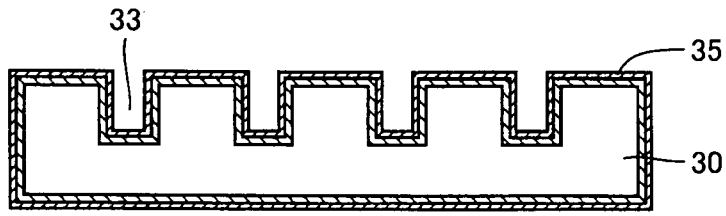
FIG. 5D shows a step of the method for manufacturing the probes.
Figure 5E:
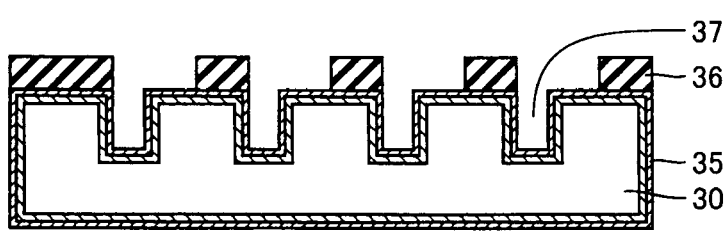
FIG. 5E shows a step of the method for manufacturing the probes.

Next, a seed layer 35, which will become probes, is formed on the surface of the substrate 30 including the grooves 33 by sputtering (FIG. 5D). Then, resists 36 are deposited on predetermined positions of the upper surface of the substrate 30 on which the seed layer 35 has been formed, but not on the grooves 33, to form a predetermined first-layered resist mold including stepped grooves 37 (FIG. 5E). Subsequently, the stepped grooves 37 are filled with nickel-cobalt by performing nickel-cobalt plating from the upper surface of the substrate 30, thereby forming nickel-cobalt hook structures 39 (FIG. 5F).

Figure 5F:
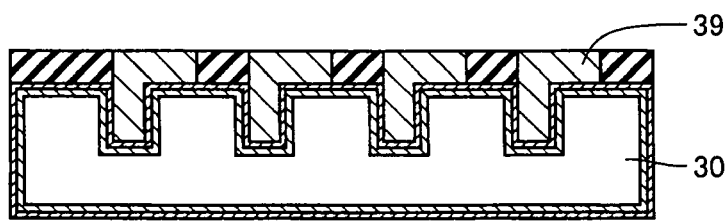
FIG. 5F shows a step of the method for manufacturing the probes.
Figure 6A:
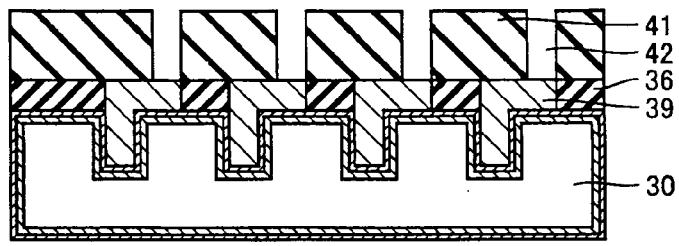
FIG. 6A shows a step of manufacturing the probes following FIG. 5F.

FIGS. 6A to 6F illustrate steps of manufacturing the probes following the step of FIG. 5F. Referring to FIG. 6A, resists 41 are deposited on predetermined positions so as to cover parts of the upper surface of the flattened hook structures 39 and resists 36. By doing this, a predetermined second-layered resist mold having grooves 42 that are not in line with the grooves 33 is formed on parts of the upper surface of the hook structures 39.

Figure 6B:
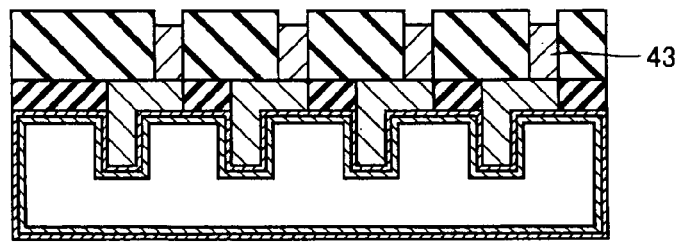
FIG. 6B shows a step of manufacturing the probes following FIG. 5F.
Figure 6C:
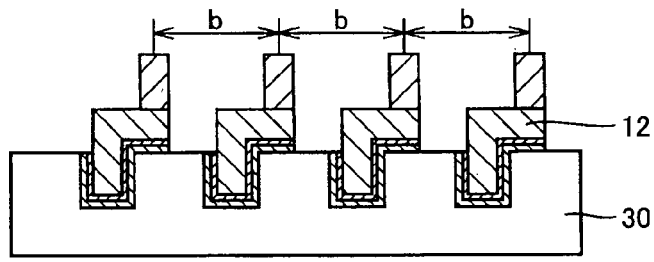
FIG. 6C shows a step of manufacturing the probes following FIG. 5F.

In this state, the second-layered resist mold is plated with nickel-cobalt so as to fill up the grooves 42 to continuously form portions 43 each extending vertically upward from one end of each hook structure 39 (FIG. 6B). The portions are not extended straight from the bottom of the hook structures 39. Subsequently, the resists 36 and 41 are removed to take out zigzag probes 12 (FIG. 6C). Then, the spacing b between the upwardly extending portions of the zigzag probes 12 is set to be almost equal to the spacing a shown in FIG. 3D. Therefore, the pitch of the probes 12 is 100 μm or less.

Figure 6D:
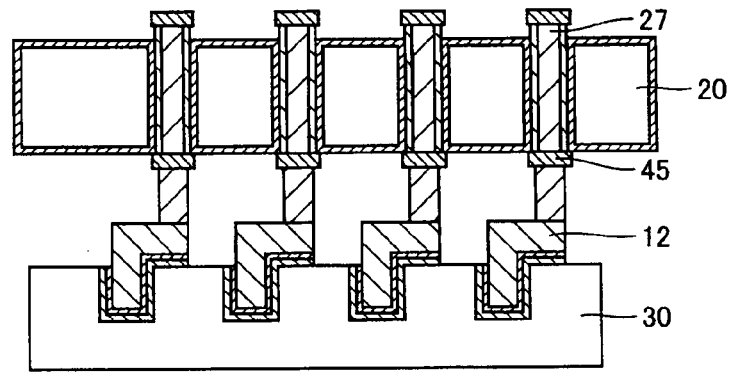
FIG. 6D shows a step of manufacturing the probes following FIG. 5F.

Next, thus formed plurality of probes 12, which stay on the substrate 30, are bonded to the pads 45 of the body 14 (FIG. 6D). In this case, the diameter or dimension of the pads 45 is set larger than the dimension of the connection parts of probes 12 to the pad 45, and therefore there is no problem even if the spacing a between the pads 45 is somewhat different from the spacing b between the portions, extending upwardly in the vertical direction, of the zigzag probes 12.

Figure 6E:
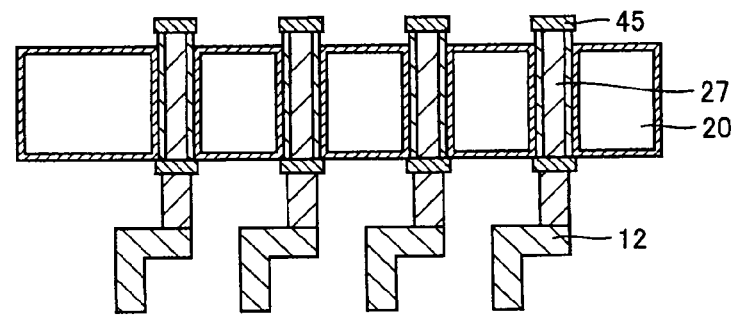
FIG. 6E shows a step of manufacturing the probes following FIG. 5F.

Next, the substrate 30 on which the plurality of probes 12 stay is removed (FIG. 6E). Consequently, an interposer having the plurality of zigzag probes 12 is manufactured. Such probes 12 formed in a zigzag shape have resilience.

This interposer is used as a probe card having the body 14 as a card body and the plurality of zigzag probes 12 formed thereon. Generally, the probe card is used to inspect objects under test for electrical characteristics, and includes a card body and probes connected to bonding portions formed on the card body. Here, the pads 45 are the bonding portions.

Each of the plurality of probes 12 includes, for example, a contact for making electrical contact with an electrode, in use for inspection, of the test object and a beam with an tip supporting the contact. The contacts are formed in the same alignment with the alignment of the electrodes, in use for inspection, of the test object.

Although the plurality of zigzag probes 12 are attached to the lower surface of the body 14 in the above embodiment, the probes 12 can be attached to the upper surface of the body 14 through the same steps. Also, the plurality of probes 12 can be attached to both the upper and lower surfaces of the body 14.

Accordingly, an interposer having a plurality of probes on one surface or both surfaces of the body 14 can be provided.

Figure 7A:
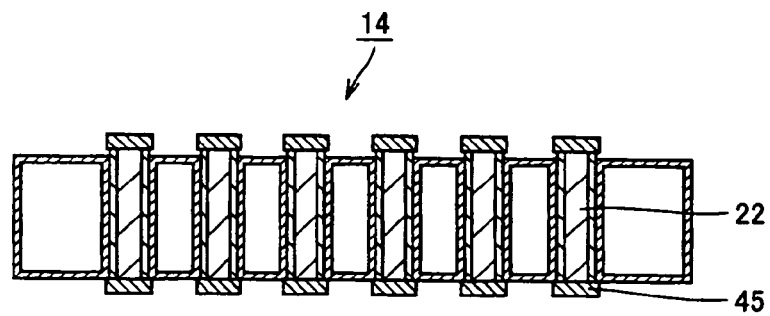
FIG. 7A illustrates a metal bonding method between pads of a body and pads of the probes.
Figure 7B:
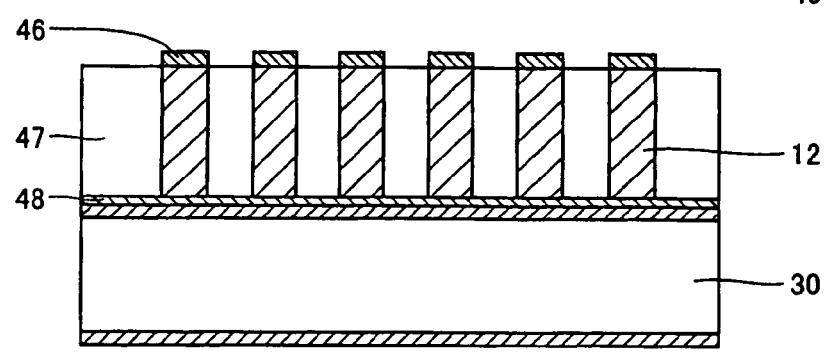
FIG. 7B illustrates the metal bonding method between the pads of the body and the pads of the probes.
Figure 8:
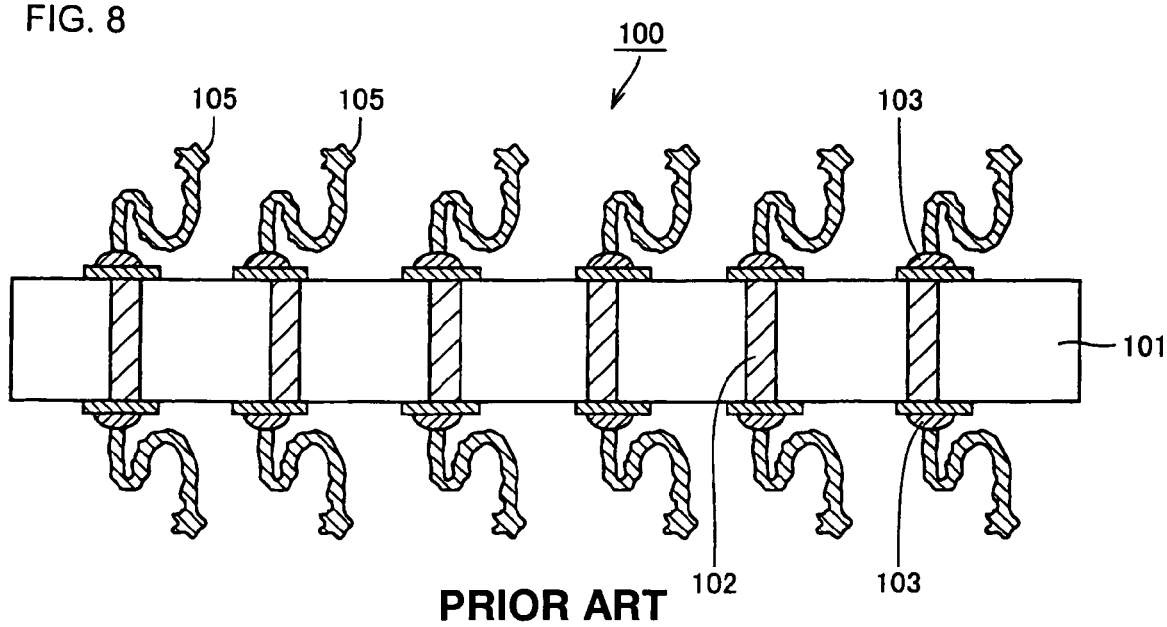
FIG. 8 shows the structure of a conventional interposer.

Next description will be made about metal bonding between pads 46 provided on probes 12 on a substrate 30 and pads 45 of the body 14. FIGS. 7A and 7B illustrate a method for bonding these pads. FIG. 7A shows a body 14 having conductive holes 22, while FIG. 7B shows a plurality of probes 12 formed on a substrate 30 in the same manner as illustrated in FIGS. 5A to 6C. In FIG. 7B, a release metal film 48 is placed between the probes 12 and substrate 30. Here, the probes 12 are not zigzag like the probes 12 shown in FIG. 6C.

In order to metallically bond the pads 45 and pads 46, the first thing to do is to perform a preliminary cleaning and acid cleaning. Next, the pads 45 and 46 are treated with hydrogen fluoride, and bonded within 60 minutes. The gold pad 46 used for metal bonding preferably protrudes by 1 μm to 2 μm above a mold 47 made of a resist. The release metal film 48 placed between the substrate 30 and probes 12 is removed; titanium is removed by hydrogen fluoride and copper is removed by mixed acid of sulfuric acid and nitric acid.

Although a silicon substrate is used as an example of a substrate that can be processed by dry etching in the above embodiment, the present invention is not limited to this and an organic substrate, silicon dioxide substrate, glass substrate or other material substrate can be used.

Although zigzag probes are provided on a body as an example in the above embodiment, the present invention is not limited to this, and any desired shaped probes can be provided on the body.

Although the conductive holes are formed by electroless copper plating in the above embodiment, the present invention is not limited to this, and the conductive holes can be formed by the electroless plating with metal other than copper, or by other types of electroplating, sputtering or the like.

The foregoing has described the embodiments of the present invention by referring to the drawings. However the invention should not be limited to the illustrated embodiments. It should be appreciated that various modifications and changes can be made to the illustrated embodiments within the scope of the appended claims and their equivalents.

INDUSTRIAL APPLICABILITY

The interposer according to the present invention includes conductive holes formed in a substrate that can be processed by dry etching, thereby enabling the continuous formation of a plurality of microscopic conductive holes. By connecting probes to the conductive holes, the interposer with the probes arranged at high density can be advantageously used.

What is claimed is:

1. A method for manufacturing an interposer including a body and a plurality of probes connected to said body, the method comprising:

a step of manufacturing said body including the sub-steps of:

preparing a first substrate having one surface side and the other surface side and being capable of being processed by dry etching;

forming a plurality of through holes in said first substrate by dry etching; and making said through holes into conductive holes through a bottom-up fill process, the conductive holes capable of conducting electricity, and wherein the bottom-up fill process includes depositing a conductive layer from a bottom portion to a top portion of the through hole;

a step of manufacturing said plurality of probes including the sub-steps of:

preparing a second substrate;

forming a desired shaped mold on a surface of said second substrate using a resist; and forming a plurality of first probes in the desired shape with said mold; and a step of connecting the ends of said plurality of conductive holes on one surface side of said first substrate and said plurality of first probes on said second substrate.

2. The method for manufacturing the interposer according to claim 1, wherein
said step of forming the desired shaped mold using the resist includes a sub-step of forming a mold to form zigzag probes.

3. The method for manufacturing the interposer according to claim 1, wherein
said step of forming said plurality of through holes in said first substrate by dry etching includes a sub-step of forming holes each having a diameter of 100 μm or less.

4. The method for manufacturing the interposer according to claim 1, wherein
said step of making said through holes into said conductive holes through the bottom-up fill process includes a sub-step of plating the through holes with conductive layers.

5. The method for manufacturing the interposer according to claim 1, wherein the bottom-up fill process includes attaching a metal plate at the bottom of the through hole and depositing a copper material by the bottom-up fill process after the through hole is made.

* * * * *

UNITED STATES PATENT AND TRADEMARK OFFICE
CERTIFICATE OF CORRECTION

| | | |
|---|---|---|
| PATENT NO. | : 7,891,090 B2 | Page 1 of 1 |
| APPLICATION NO. | : 11/884075 | |
| DATED | : February 22, 2011 | |
| INVENTOR(S) | : Masami Yakabe and Tomohisa Hoshino | |

It is certified that error appears in the above-identified patent and that said Letters Patent is hereby corrected as shown below:

In item [86] on the cover page of the patent, replace "PCT/JP2006/002238" with:

--PCT/JP2006/302238--

Signed and Sealed this
Tenth Day of May, 2011

David J. Kappos
*Director of the United States Patent and Trademark Office*